(12) United States Patent
Kimura et al.

(10) Patent No.: US 8,895,956 B2
(45) Date of Patent: Nov. 25, 2014

(54) SEMICONDUCTOR LIGHT EMITTING DEVICE

(75) Inventors: Shigeya Kimura, Kanagawa-ken (JP);
Koichi Tachibana, Kanagawa-ken (JP);
Hajime Nago, Kanagawa-ken (JP);
Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/218,827

(22) Filed: Aug. 26, 2011

(65) Prior Publication Data
US 2012/0153253 A1    Jun. 21, 2012

(30) Foreign Application Priority Data

Dec. 15, 2010   (JP) ................. 2010-278993

(51) Int. Cl.
*H01L 33/04* (2010.01)
*H01L 33/32* (2010.01)
*H01L 33/06* (2010.01)

(52) U.S. Cl.
CPC ................ *H01L 33/06* (2013.01); *H01L 33/32* (2013.01)
USPC ............... 257/13; 438/29; 438/605; 438/405; 438/22; 438/47

(58) Field of Classification Search
USPC ........ 257/13, 94, E33.025, E33.027, E33.008
See application file for complete search history.

(56) References Cited

U.S. PATENT DOCUMENTS

| | | | |
|---|---|---|---|
| 2005/0001251 A1* | 1/2005 | Itokawa et al. | 257/296 |
| 2005/0098789 A1* | 5/2005 | Kozaki | 257/97 |
| 2011/0215351 A1* | 9/2011 | Kimura et al. | 257/94 |

FOREIGN PATENT DOCUMENTS

| | | |
|---|---|---|
| JP | 10-32349 A | 2/1998 |
| JP | 10-303459 | 11/1998 |
| JP | 10-303505 | 11/1998 |
| JP | 2001-94151 | 4/2001 |
| JP | 2005-129923 | 5/2005 |
| JP | 2006-237281 A | 9/2006 |
| JP | 2011-501408 | 1/2011 |
| WO | WO 2009/048425 A1 | 4/2009 |

OTHER PUBLICATIONS

Office Action issued Jun. 9, 2014 in Japanese Patent Application No. 2010-278993 (with English translation).
Office Action issued on Mar. 20, 2014 in the counterpart Japanese Patent Application No. 2010-278993 (with English Translation).

(Continued)

*Primary Examiner* — Chuong A Luu
*Assistant Examiner* — Rodolfo Fortich
(74) *Attorney, Agent, or Firm* — Oblon, Spivak, McClelland, Maier & Neustadt, L.L.P.

(57) ABSTRACT

According to one embodiment, a semiconductor light emitting device includes an n-type first semiconductor layer, a p-type second semiconductor layer and a light emitting layer. The light emitting layer is provided between the first and second semiconductor layers, and includes a plurality of barrier layers including a nitride semiconductor and a well layer provided between the barrier layers and including a nitride semiconductor containing In. The barrier layers and the well layer are stacked in a first direction from the second semiconductor layer toward the first semiconductor layer. The well layer has a p-side interface part and an n-side interface part. Each of the p-side and the n-side interface part include an interface with one of the barrier layers. A variation in a concentration of In in a surface perpendicular to the first direction of the p-side interface part is not more than that of the n-side interface part.

20 Claims, 7 Drawing Sheets

(56) References Cited

OTHER PUBLICATIONS

Office Action issued Oct. 24, 2011 in Japan Application No. 2010-278993 (With English Translation).
U.S. Appl. No. 13/214,690, filed Aug. 22, 2011, Tomonari Shioda, et al.
M. J. Galtrey, et al., "Three-dimensional atom probe analysis of green- and blue-emitting $In_xGa_{1-x}N/GaN$ multiple quantum well structures", Journal of Applied Physics, 104, 013524, 2008, pp. 013524-1 to 013524-7.
Japanese Office Action issued Apr. 11, 2014, in Japan Patent Application No. 2012-085835 (with English translation).
Japanese Office Action Issued Jun. 24, 2013 in Patent Application No. 2012-085835 (with English translation).
Notification of Reason(s) for Refusal issued Jul. 2, 2012 in Japanese Patent Application No. 2010-278993 (with English translation).

* cited by examiner

SEMICONDUCTOR LIGHT EMITTING DEVICE

CROSS-REFERENCE TO RELATED APPLICATIONS

This application is based upon and claims the benefit of priority from the prior Japanese Patent Application No. 2010-278993, filed on Dec. 15, 2010; the entire contents of which are incorporated herein by reference.

FIELD

Embodiments described herein relate generally to a semiconductor light emitting device.

BACKGROUND

Nitride semiconductors are applied to ultraviolet, blue, and green Light Emitting Diodes (LED), or blue-violet and blue Laser Diodes (LDs). With such semiconductor light emitting devices, further enhancement of operation characteristics such as light emission efficiency and operating voltage is required.

DETAILED DESCRIPTION

Figure 1:
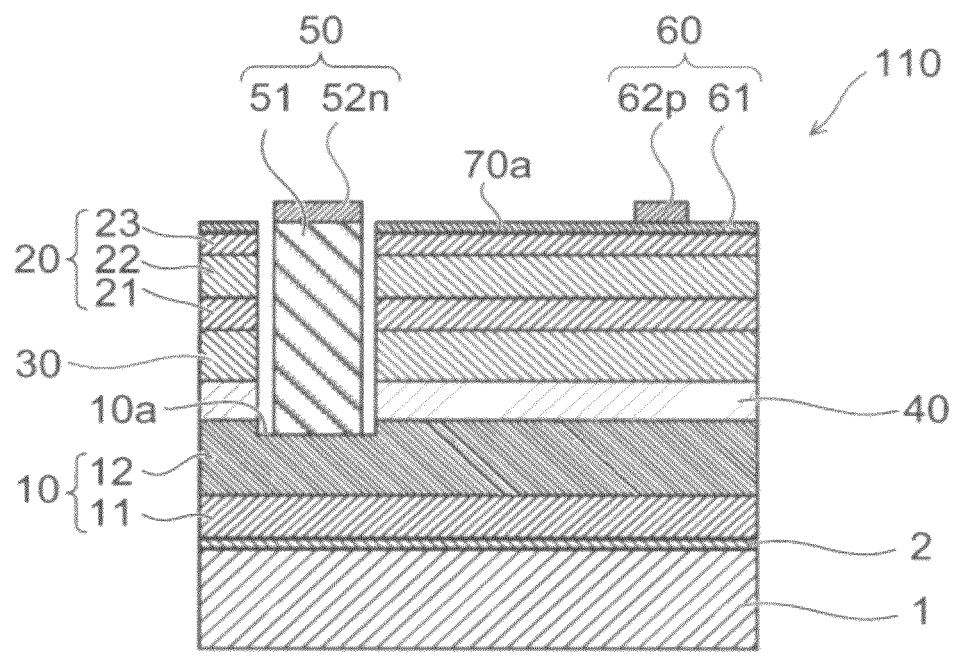
FIG. 1 is a schematic cross-sectional view showing a semiconductor light emitting device according to an embodiment.

In general, according to one embodiment, a semiconductor light emitting device includes a first semiconductor layer of an n-type, a second semiconductor layer of a p-type and a light emitting layer.

The light emitting layer is provided between the first semiconductor layer and the second semiconductor layer, and includes a plurality of barrier layers and a well layer. The barrier layers include a nitride semiconductor. The well layer is provided between the barrier layers and includes a nitride semiconductor containing In. The barrier layers and the well layer are stacked in a first direction from the second semiconductor layer toward the first semiconductor layer.

The well layer has a p-side interface part and an n-side interface part. The p-side interface part includes an interface with the barrier layer on a side of the second semiconductor layer when viewed from the well layer, and the n-side interface part includes an interface with the barrier layer on a side of the first semiconductor layer when viewed from the well layer.

A variation in a concentration of In in a surface perpendicular to the first direction of the p-side interface part is not more than a variation in a concentration of In in a surface perpendicular to the first direction of the n-side interface part.

Various embodiments will be described hereinafter with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

FIG. 1 is a schematic cross-sectional view illustrating the configuration of a semiconductor light emitting device according to an embodiment.

Figure 2:
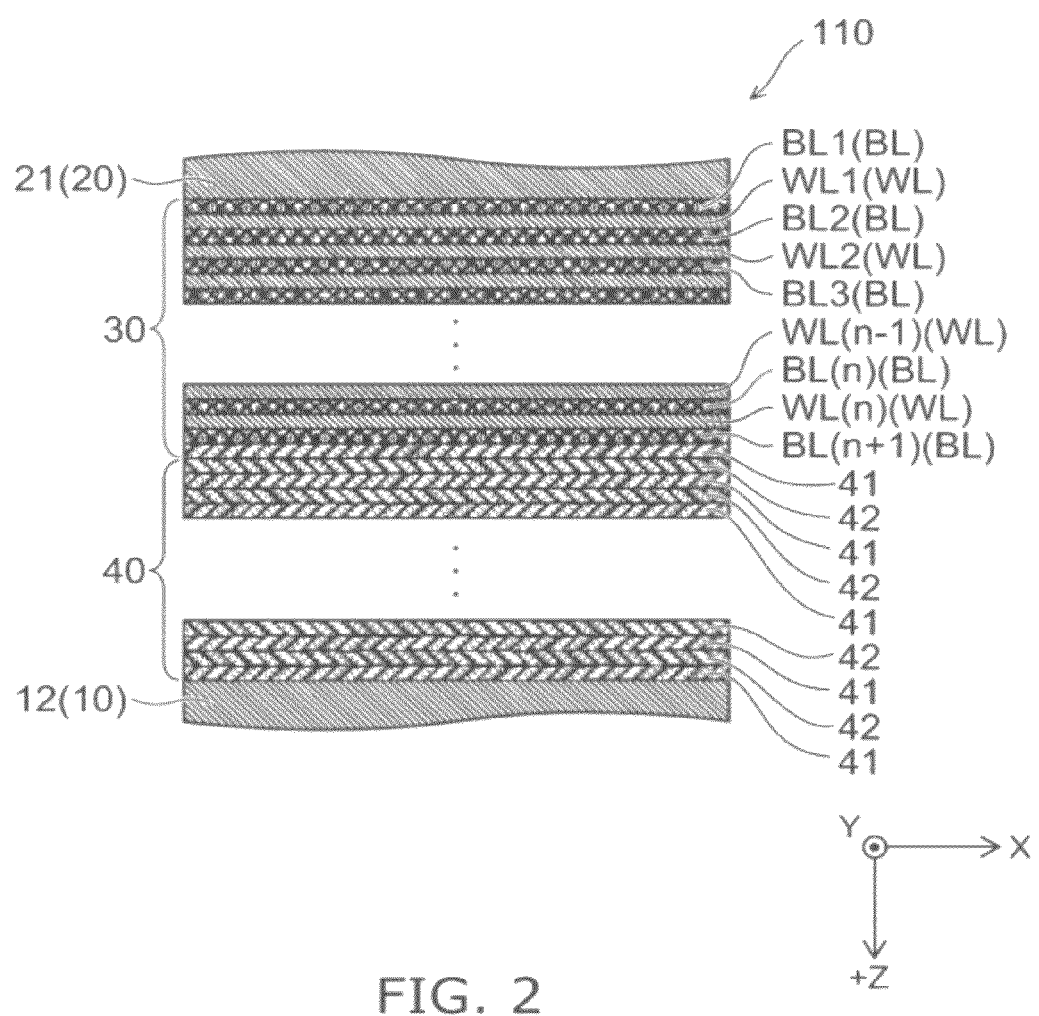
FIG. 2 is a schematic cross-sectional view showing a part of the semiconductor light emitting device according to the embodiment.

FIG. 2 is a schematic cross-sectional view illustrating the configuration of a part of the semiconductor light emitting device according to the embodiment.

Figure 3:
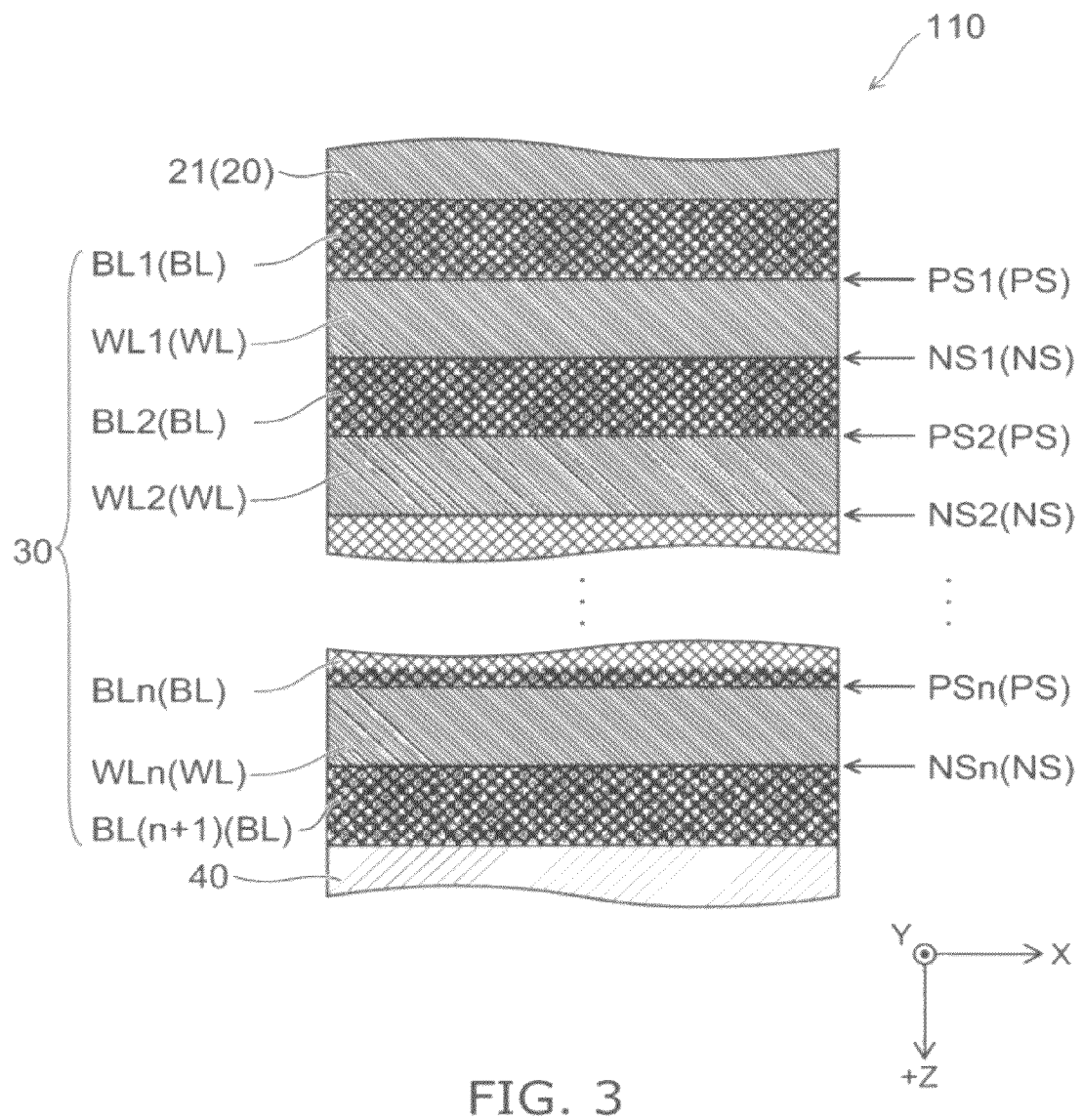
FIG. 3 is an enlarged schematic cross-sectional view of a part of the semiconductor light emitting device according to the embodiment.

FIG. 3 is an enlarged schematic cross-sectional view of a part of the semiconductor light emitting device according to the embodiment.

As shown in FIG. 1, a semiconductor light emitting device 110 according to an embodiment comprises a first n-type semiconductor layer 10, a second p-type semiconductor layer 20, and a light emitting layer 30 provided between the first semiconductor layer 10 and the second semiconductor layer 20. The first semiconductor layer 10 and the second semiconductor layer 20 include a nitride semiconductor, for example.

Here, a direction going from the second semiconductor layer 20 toward the first semiconductor layer 10 is defined as the +Z direction (first direction). A direction perpendicular to the +Z direction is defined as the X-axis direction. A direction perpendicular to the +Z direction and also perpendicular to the X-axis direction is defined as the Y-axis direction.

As shown in FIG. 2, the light emitting layer 30 includes a plurality of barrier layers BL stacked in the +Z direction and well layers WL provided between the barrier layers BL. The well layer WL contains In. The barrier layer BL and the well layer WL include nitride semiconductors. For example, the barrier layer BL includes GaN. The well layer WL includes InGaN. The barrier layer BL does not substantially contain In, for example. If, otherwise, the barrier layer BL contains In, the concentration of In in the barrier layer BL is lower than that of In in the well layer WL.

The semiconductor light emitting device 110 is an LED using a nitride semiconductor, for example.

As shown in FIG. 1, a buffer layer 2 is provided on a substrate 1 of c-plane sapphire, for example. The substrate 1 is provided on the first semiconductor layer 10 on an opposite side to the light emitting layer 30. The buffer layer 2 has a foundation layer 11 provided thereon, for example. The foundation layer 11 has an n-type contact layer 12 provided thereon. GaN, for example, is used for the n-type contact layer 12. Undoped GaN, for example, is used for the foundation layer 11. The n-type contact layer 12 is included in the first semiconductor layer 10. For convenience, it may be regarded that the foundation layer 11 is included in the first semiconductor layer 10.

In the specific example, a stacked body 40 is provided on the n-type contact layer 12. In the stacked body 40, for example, a plurality of first layers 41 and a plurality of second layers 42 are alternately stacked. The stacked body 40 has a superlattice structure, for example. The stacked body 40 may be provided or omitted as necessary.

The stacked body 40 has the light emitting layer 30 (active layer) provided thereon. The light emitting layer 30 has a Multiple Quantum Well (MQW) structure, for example.

As shown in FIG. 2, the light emitting layer 30 may have a structure in which the barrier layer BL and the well layers WL are alternately stacked. In addition, with regard to the light emitting layer 30, the well layer WL may have a SQW (Single Quantum Well) arrangement.

As shown in FIG. 1, the light emitting layer 30 has the second semiconductor layer 20 provided thereon. The second semiconductor layer 20 includes, for example, a first p-type layer 21, a second p-type layer 22, and a third p-type layer 23. The first p-type layer 21 is provided between the third p-type layer 23 and the light emitting layer 30. The second p-type layer 22 is provided between the first p-type layer 21 and the third p-type layer 23.

A p-type AlGaN layer, for example, is used for the first p-type layer 21. A p-type GaN layer 22, for example, is used for the second p-type layer 22. A p-type GaN, for example, layer is used for the third p-type layer 23. The p-type impurity concentration (e.g., Mg) in the third p-type layer 23 is higher than that in the second p-type layer 22. The first p-type layer has a function of the electronic overflow prevention (suppression) layer, for example. The third p-type layer 23 has a function of a contact layer.

The third p-type layer 23 has the second contact electrode part 61 provided thereon. The second contact electrode part 61 is, for example, a transparent electrode translucent to light emitted from the light emitting layer 30. A p-side pad electrode part 62p is provided on a part of the second contact electrode part 61. A stacked structure of Ni/Au, for example, is used for the p-side pad electrode part 62p.

A part of the n-type contact layer 12, as well as the stacked body 40, the light emitting layer 30, and the second semiconductor layer 20 corresponding to the part are removed. Thus, a part of the n-type contact layer 12 is exposed. The first contact electrode part 51 is provided on a surface 10a through which the n-type contact layer 12 is exposed.

The first contact electrode part 51 has, for example, a stacked structure of Ti/Al/Ta/Ti/Pt. The first contact electrode part 51 has an n-side pad electrode 52n provided thereon. The n-side pad electrode 52n has, for example, a stacked structure of Ni/Au. The n-side pad electrode 52n is provided on a part of or the entire surface of the first contact electrode part 51.

The structure and materials described above as to the first contact electrode part 51, the n-side pad electrode 52n, the second contact electrode part 61, and the p-side pad electrode part 62p are an example and the embodiment is not limited thereto.

The first layer 41 of the stacked body 40 includes, for example, $In_xGa_{1-x}N$ ($0 \leq x < 1$). The second layer 42 includes, for example, $In_yGa_{1-y}N$ ($0 < y \leq 1$, $x < y$).

The barrier layer BL includes $In_bGa_{1-b}N$ ($0 \leq b < 1$). The well layer WL includes $In_wGa_{1-w}N$ ($0 < w < 1$, $b < w$). The barrier layer BL and the well layer WL may contain a small amount of Al or the like.

The thickness of the barrier layer BL is 5 or more nanometers (nm) and 10 nm or less, for example. The thickness of the well layer WL is 2 nm or more and 6 nm or less, for example.

If, for example, the peak wavelength of the emitted light is 450 nm, GaN or the like is used for the barrier layer BL, and $In_{0.15}Ga_{0.85}N$ is used for the well layer WL.

As shown in FIG. 3, the light emitting layer 30 has the barrier layer BL and the well layer WL alternately stacked for six to nine cycles, for example. The number of barrier layer BL is nine, and the number of well layers WL is eight, for example. In the embodiment, the number of well layers WL (and the number of barrier layer BL) is arbitrary.

The well layer WL includes a first well layer WL1 to an n-th well layer WLm, for example. Here, "m" is an integer of 1 or larger. For example, it is assumed that an (i+1)-th well layer WL (i+1) is disposed between an i-th well layer WLi and the first semiconductor layer 10. Here, "i" is an integer of 1 or larger.

The barrier layer BL includes, for example, a first barrier layer BL1 to an (m+1)-th barrier layer BL (m+1). For example, it is assumed that the (i+1)-th barrier layer BL (i+1) is disposed between the i-th barrier layer BLi and the first semiconductor layer 10. It is assumed that the i-th well layer WLi is disposed between the i-th barrier layer BLi and the (i+1)-th barrier layer BL (i+1).

As shown in FIG. 3, the well layer WL has a p-side interface part PS and an n-side interface part NS. The p-side interface part PS is a part including an interface with the barrier layer BL at the side of the second semiconductor layer 20 when seen from the well layer WL. The n-side interface part NS is a part including an interface with the barrier layer BL at the side of the first semiconductor layer 10 when seen from the well layer WL.

The p-side interface part PS includes a first p-side interface part PS1 to an m-th p-side interface part PSm. The i-th p-side interface part PSi is a part including an interface of the i-th well layer WLi between the i-th well layer WLi and the i-th barrier layer BLi.

The n-side interface part NS includes a first n-side interface part NS1 to an m-th n-side interface part NSm. The i-th n-side interface part NSi is a part including an interface of the i-th well layer WLi between the i-th well layer WLi and the (i+1)-th barrier layer BL (i+1).

In the embodiment, the variation in the concentration of In in a surface perpendicular to the +Z direction of the p-side interface part PS does not exceed the variation in the concentration of In in a surface perpendicular to the +Z direction of the n-side interface part NS.

For example, the variation in the concentration of In in a surface perpendicular to the +Z direction of the i-th p-side interface part PSi does not exceed the variation in the concentration of In in a surface perpendicular to the +Z direction of the i-th n-side interface part NSi.

Consequently, the operating voltage is reduced.

For example, the variation in the concentration of In in a surface perpendicular to the +Z direction of the p-side interface part PS can be expressed by the Root Mean Square (RMS) of the 3-dimensional irregularity of the In iso-concentration surface in a surface perpendicular to the +Z direction in the p-side interface part PS. The variation in the concentration of In in a surface perpendicular to the +Z direction of the n-side interface part NS can be expressed by the Root Mean Square (RMS) of the 3-dimensional irregularity of the In iso-concentration surface in a surface perpendicular to the +Z direction in the n-side interface part NS.

In other words, the RMS of the 3-dimensional irregularity of the In iso-concentration surface in a surface perpendicular to the +Z direction of the i-th p-side interface part PSi does not exceed the RMS of the 3-dimensional irregularity of the In iso-concentration surface in a surface perpendicular to the +Z direction of the i-th n-side interface part NSi, for example, in the embodiment.

Such a configuration according to the embodiment is based on new discovery made in an experiment performed by the inventors. The experiment will be described in the following.

The substrate 1 of the c-plane sapphire is introduced into a reactor of a MOCVD (Metal Organic Chemical Vapor Deposition) device. The substrate 1 is heated to 1100° C. on a susceptor of the reactor. Thus, oxidation films on the surface of substrate 1 were removed.

The buffer layer 2 having a thickness of 30 nm has been formed on the substrate 1. An undoped GaN layer having a thickness of 3 micrometers (μm) has been formed on the buffer layer 2 as the foundation layer 11. Furthermore, an Si-doped GaN layer having a thickness of 2 μm has been formed on the foundation layer 11 as the n-type contact layer 12.

The stacked body 40 has been formed on the n-type contact layer 12. The light emitting layer 30 of the MQW structure having the barrier layer BL and the well layer WL stacked thereon has been formed on the stacked body 40. The barrier layer BL is a GaN layer. The well layer WL is an $In_{0.15}Ga_{0.85}N$ layer with its In composition ratio being 15%. In the experiment, the barrier layer BL and the well layer WL have been alternately stacked for eight cycles, where the last barrier layer BL (first barrier layer BL1) has been formed on the top level well layer WL (first well layer WL1). The thickness of the barrier layer BL is 5 nm. The thickness of the well layer WL is 2.5 nm.

Two AlGaN layers have been formed on the light emitting layer 30 as the first p-type layer 21. In other words, the first AlGaN layer having a thickness of 5 nm and an Al composition ratio of 0.3% has been formed on the light emitting layer 30. The second AlGaN layer having a thickness of 5 nm and an Al composition ratio of 10% has been formed thereon. The content of Mg in the second AlGaN layer is $5 \times 10^{19}/cm^3$. A p-type GaN layer having a thickness 80 nm has been formed on the first p-type layer 21 as the second p-type layer 22. The concentration of Mg in the second p-type layer 22 is $2 \times 10^{19}/cm^3$. A p-type GaN layer having a thickness around 10 nm has been formed on the second p-type layer 22 as the third p-type layer 23. The concentration of Mg in the third p-type layer 23 is $1 \times 10^{21}/cm^3$. Subsequently, the substrate 1 has been taken out from the reactor of the MOCVD apparatus.

Dry etching has been performed on a part of the above-mentioned sample to expose a part of the n-type contact layer 12. The first contact electrode part 51 of a multilayer structure of Ti/Pt/Au has been formed on the exposed n-type contact layer 12. In addition, a transparent electrode (ITO: Indium Tin Oxide) has been formed on the second semiconductor layer 20 (p-type layer 23) as the second contact electrode part 61. The second contact electrode part 61 is provided on the second semiconductor layer 20 on an opposite side to the light emitting layer 30. Furthermore, the p-side pad electrode part 62$p$ of a stacked structure of Ni/Au having a diameter of 80 μm has been formed on a part thereof.

Consequently, a semiconductor light emitting device is provided.

In the experiment, a plurality of samples (samples S1 to S5 described below) have been fabricated by changing the condition of forming the semiconductor layer. The light emission characteristics of the samples thus obtained has been evaluated. As a result, samples with a high operating voltage and samples with a low operating voltage have been found. The inventors have performed various analyses with regard to the relation between the difference of such characteristics and the status of the light emitting layer of the semiconductor light emitting device. The inventors thus have found out that the characteristics of variation in the concentration of In in the surface of the well layer WL is related to the operation characteristic.

In the following, description will be provided with regard to the evaluation of variation in the concentration of In in the surface of the light emitting layer 30. The inventors have measured the concentration distribution of In on the surface of the light emitting layer 30 of the sample using the 3-dimensional atom probe (3DAP) method and obtained a 3-dimensional element map.

FIG. 4A, FIG. 4B, FIG. 5A and FIG. 5B are schematic views illustrating the characteristics of the semiconductor light emitting devices.

In other words the drawings illustrate the 3-dimensional element map of the iso-concentration surface of In of the well layer WL.

The 3-dimensional element map is drawn based on the measurement using 3DAP of the concentration of In within a predetermined measurement range of the well layer WL. The measurement range is within a diameter of 30 nm on the surface perpendicular to the +Z direction (X-Y plane). The In iso-concentration surface is drawn based on the concentration of In within the measurement range. In the example, the In iso-concentration surface is a surface on which the concentration of In is 4.0 atomic percent (atomic %).

Figure 4A:
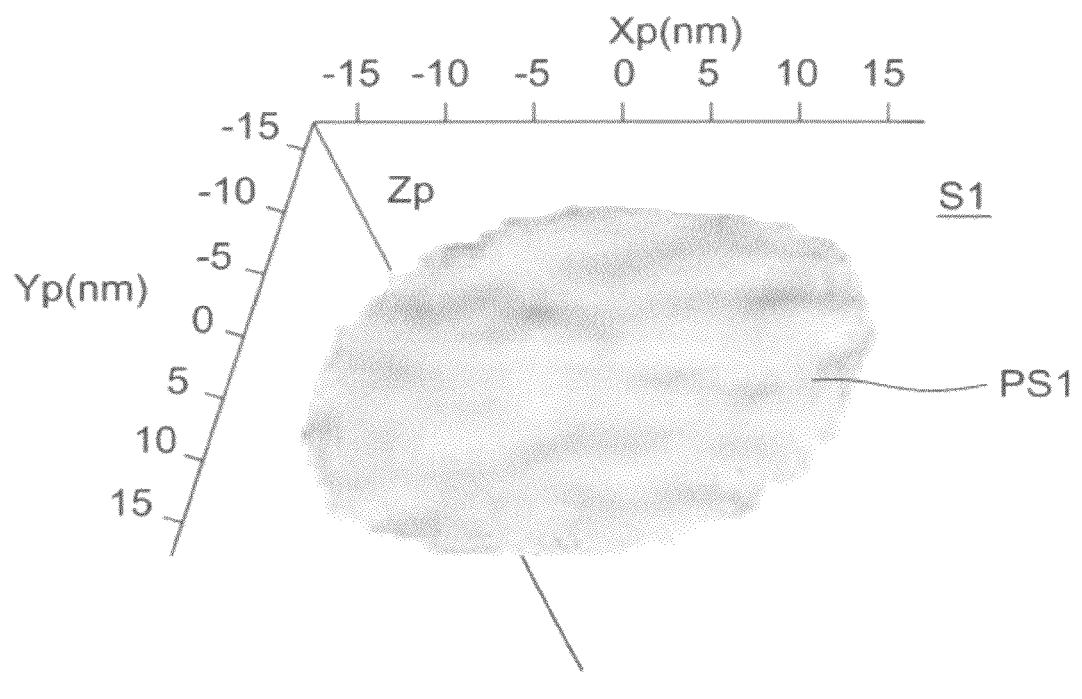
FIG. 4A to FIG. 5B are schematic views showing the characteristics of the semiconductor light emitting devices.
Figure 4B:
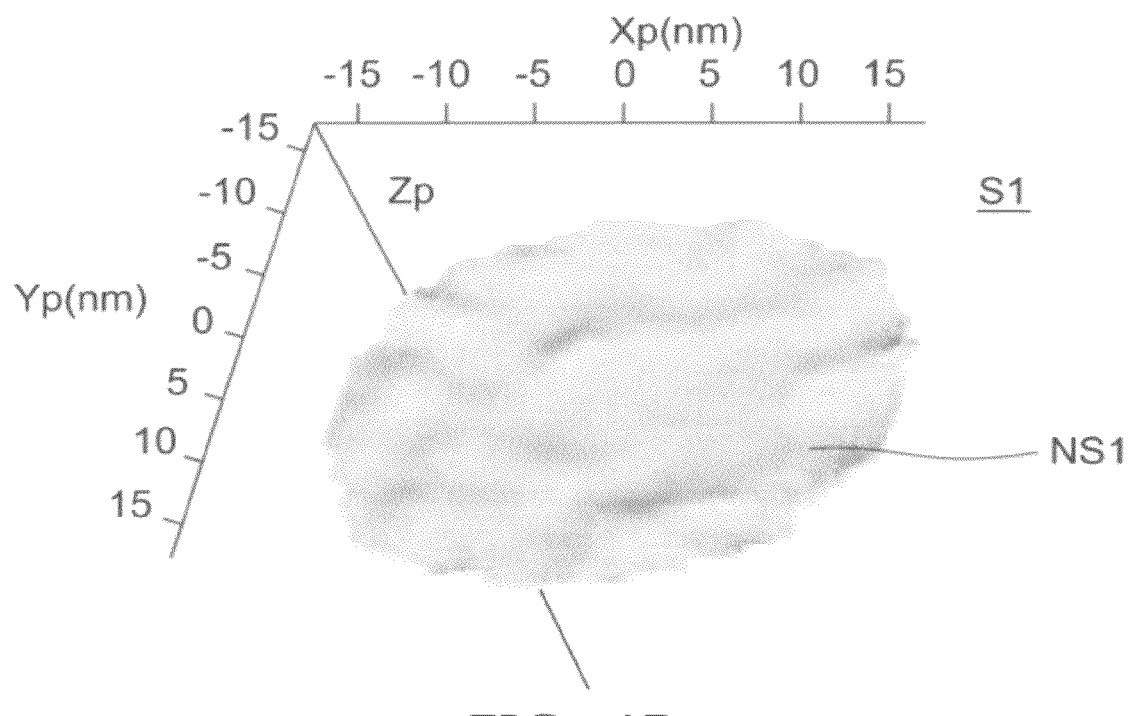
Figure 5A:
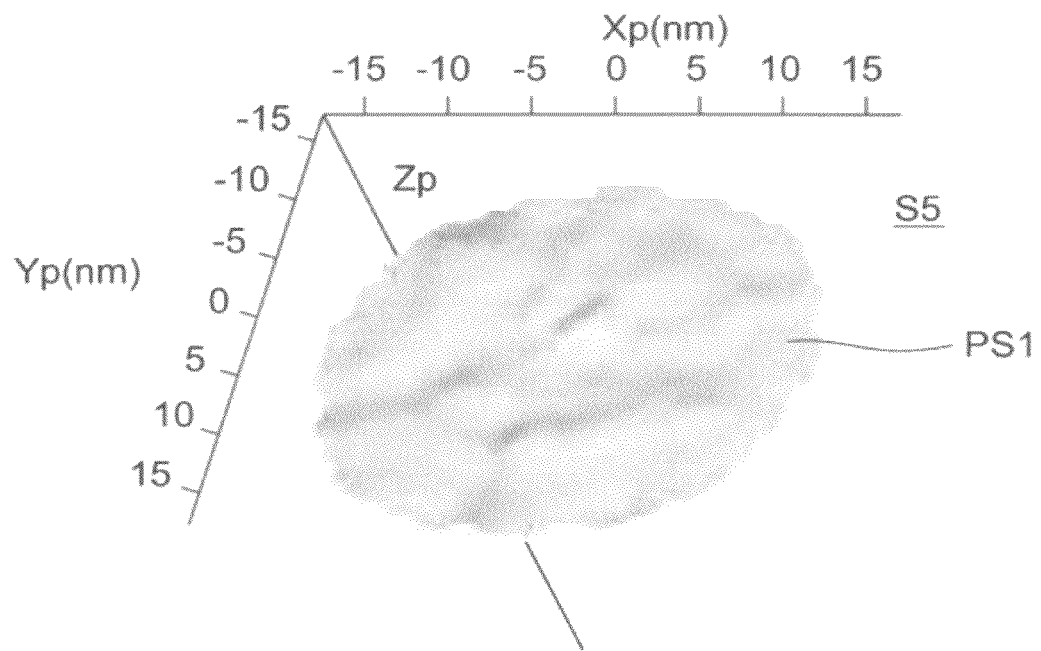
Figure 5B:
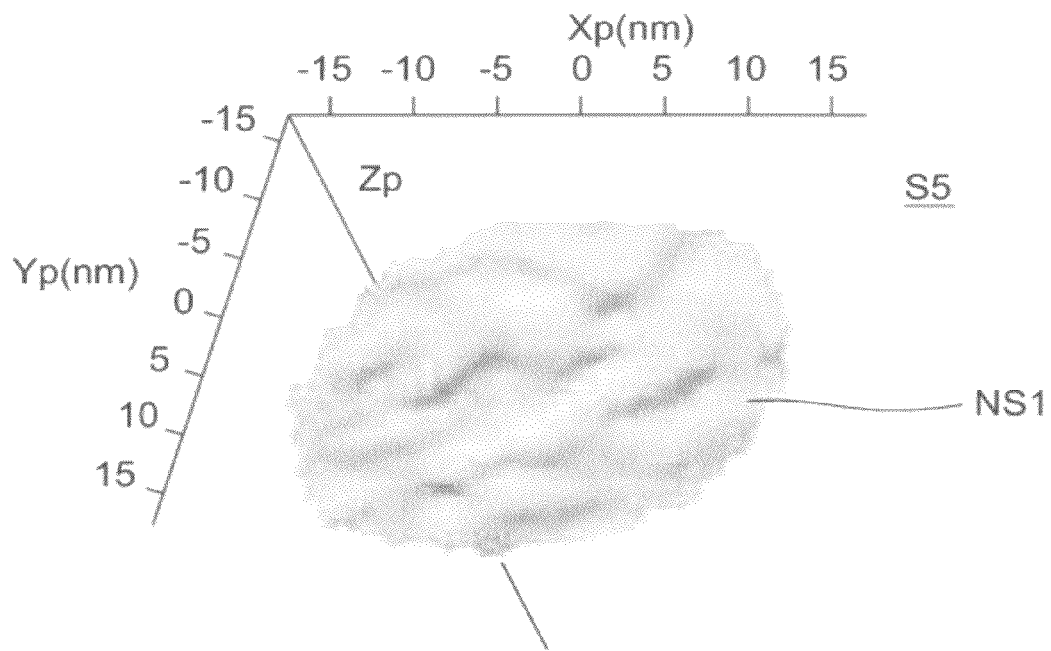

FIGS. 4A and 5A correspond to the iso-concentration surface of In in the p-side interface part PS of the well layer WL (first p-side interface part PS1 in the example). FIGS. 4B and 5B correspond to the iso-concentration of surface In in the n-side interface part NS of the well layer WL (first n-side interface part NS1 in the example).

In the drawings, Xp is a position in the X-axis direction. Yp is a position in the Y-axis direction. Zp is a position in the +Z direction.

FIGS. 4A and 4B relate to the sample S1. FIGS. 5A and 5B relate to the sample S5. The samples S1 and S5 differ in the formation condition of the semiconductor layer. The drive voltage of the sample S1 is lower than that of the sample S5.

For the sample S1, as shown in FIG. 4A, the In iso-concentration surface of the first the p-side interface part PS1 is relatively flat. There is an irregularity in the concentration surface of In on the first n-side interface part NS1, as shown in 4B. For the sample S1, as can be seen, the intra-surface variation in the concentration of In at the first p-side interface part PS1 is smaller than the intra-surface variation in the concentration of In at the first n-side interface part NS1. The RMS of the In iso-concentration surface on the first the p-side interface part PS1 is 0.24 nm. The RMS of the In iso-concentration surface on the first n-side interface part NS1 is 0.25 nm.

For the sample S5, there is a large irregularity on the In iso-concentration surface of the first p-side interface part PS1 and the first n-side interface part NS1, as shown in FIGS. 5B and 5B. For the sample S5, the RMS of the In iso-concentration surface on the first p-side interface part PS1 is 0.26 nm. The RMS of the In iso-concentration surface on the first n-side interface part NS1 is 0.23 nm. For the sample S5, as can be seen, the intra-surface variation in the concentration of In at the first p-side interface part PS1 is larger than the intra-surface variation in the concentration of In at the first n-side interface part NS1.

As thus described, the inventors have paid attention to the fact that there is a difference in the intra-surface variation in the concentration of In of the well layer WL between the sample S1 having a low operating voltage and the sample S5 having a high operating voltage. The inventors thus have found out that the operating voltage can be reduced when the variation in the concentration of In in the surface of the p-side interface part PS does not exceed the variation in the concentration of In in the surface of the n-side interface part NS. This property has been found out for the first time by the original experiment performed by the inventors.

Figure 6:
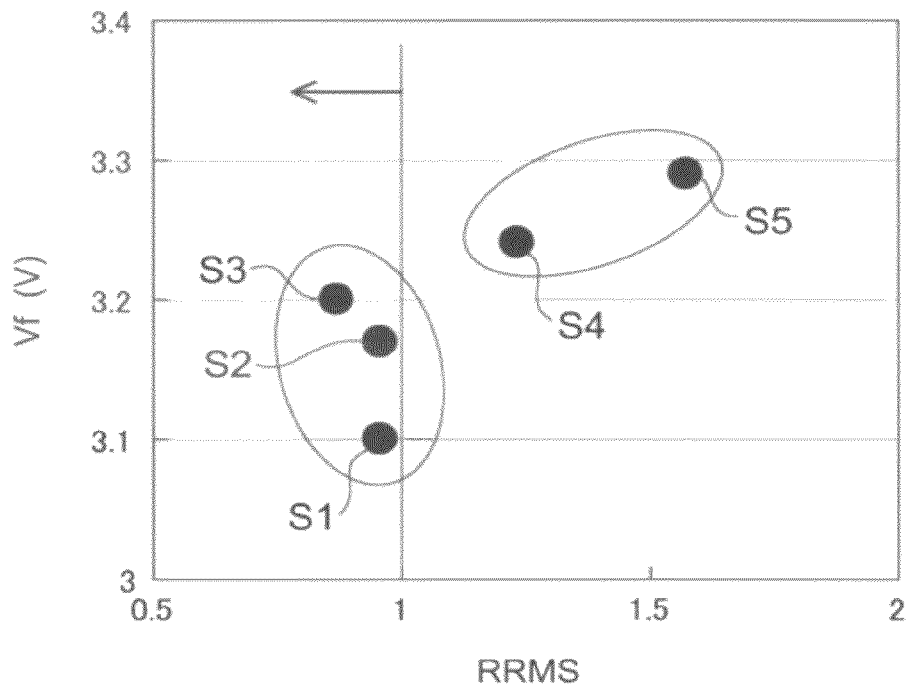
FIG. 6 and FIG. 7 are graphs showing the characteristics of the semiconductor light emitting devices.

FIG. 6 is a graph illustrating the characteristics of the semiconductor light emitting devices.

The graph illustrates the characteristics of various samples (samples S1 to S5) of the semiconductor light emitting device created by an experiment. The horizontal axis of FIG. 6 indicates the ratio RRMS between the RMS (RMSP1) of the In iso-concentration surface on the first p-side interface part PS1 of the well layer WL, and the RMS (RMSN1) of the In iso-concentration surface on the first n-side interface part NS1. RRMS is calculated by RMSP1/RMSN1. The RRMS being one or less corresponds to the variation in the concentration of In of the p-side interface part PN1 not exceeding the variation in the concentration of In of the first n-side interface part NS1. The vertical axis of FIG. 6 indicates the operating voltage Vf.

As shown in FIG. 6, the smaller the RRMS is, the lower the operating voltage Vf becomes. The operating voltage Vf is particularly small if the RRMS does not exceed one.

Based on the characteristic, the RRMS is set equal to or less than 1 in the semiconductor light emitting device 110 according to the embodiment.

In the semiconductor light emitting device 110 according to the embodiment, as thus described, the RMS of the 3-dimensional irregularity of the In iso-concentration surface in the surface of the p-side interface part PS is set equal to or less than the RMS of 3-dimensional irregularity of the In iso-concentration surface in the surface of the n-side interface part NS. Accordingly, the operating voltage Vf can be reduced.

For example, it is considered that scattering of the hole injected into the light emitting layer 30 from the second semiconductor layer 20 can be suppressed, if the RMS of the p-side interface part PS does not exceed the RMS of the n-side interface part NS.

A hole is injected into the light emitting layer 30 from the second semiconductor layer 20. In other words, the hole is injected into the well layer WL from the p-side interface part PS. It is considered that, if the RMS of the p-side interface part PS does not exceed the RMS of the n-side interface part NS, the injected hole becomes difficult to be scattered at the p-side interface part PS and the hole is injected into the well layer WL with a high efficiency.

The barrier layer BL and the well layer WL are alternately stacked. It is considered that, among the well layers WL, the well layer WL nearest to the second semiconductor layer 20 largely contributes to light emission. Therefore, in the well layer WL nearest to the second semiconductor layer 20 (first well layer WL1), it is particularly desirable to keep the RMS of the first p-side interface part PS1 from exceeding the RMS of the first n-side interface part NS1. Accordingly, the degree of improving the efficiency of injecting the hole into the light emitting layer 30 from the second semiconductor layer 20 rises. The effect of reducing the operating voltage Vf is exerted more effectively thereby.

In the embodiment, the variation in the concentration of In in the surface of the p-side interface part PS of the well layer WL (e.g., RMS of the In iso-concentration surface) is kept from exceeding the variation in the concentration of In in the surface of the n-side interface part NS (e.g., RMS of the In iso-concentration surface), the configuration of which has been discovered for the first time by the experiment of the inventors. In the past, there have been reported an exemplary measurement of the RMS of the In iso-concentration surface of the p-side interface part PS of the well layer WL, and the RMS of the In iso-concentration surface of the n-side interface part NS. However, in the previous reports, the RMS of the In iso-concentration surface of the p-side interface part PS is larger than the RMS of the In iso-concentration surface of the n-side interface part NS. For example, the RMS of the In iso-concentration surface of the p-side interface part PS is 0.34 nm, and the RMS of the In iso-concentration surface of the n-side interface part NS is 0.18 nm. As thus described, the embodiment provides good operation characteristics due to the unique configuration which was not known before.

Furthermore, there is a technique for devising the RMS with regard to the irregularity (e.g., surface asperity) of the physical structure of the surface of the substrate and the p-side contact layer used for the semiconductor light emitting device. On the contrary, the embodiment pays attention on the variation in the intra-surface concentration of In included in the well layer WL instead of the irregularity of the physical structure. The RMS of the In iso-concentration surface, for example, is employed as the index with regard to the intra-surface variation in the concentration of In in the well layer WL. Accordingly, the efficiency injecting a hole into the light emitting layer 30 from the second semiconductor layer 20 is enhanced.

Figure 7:
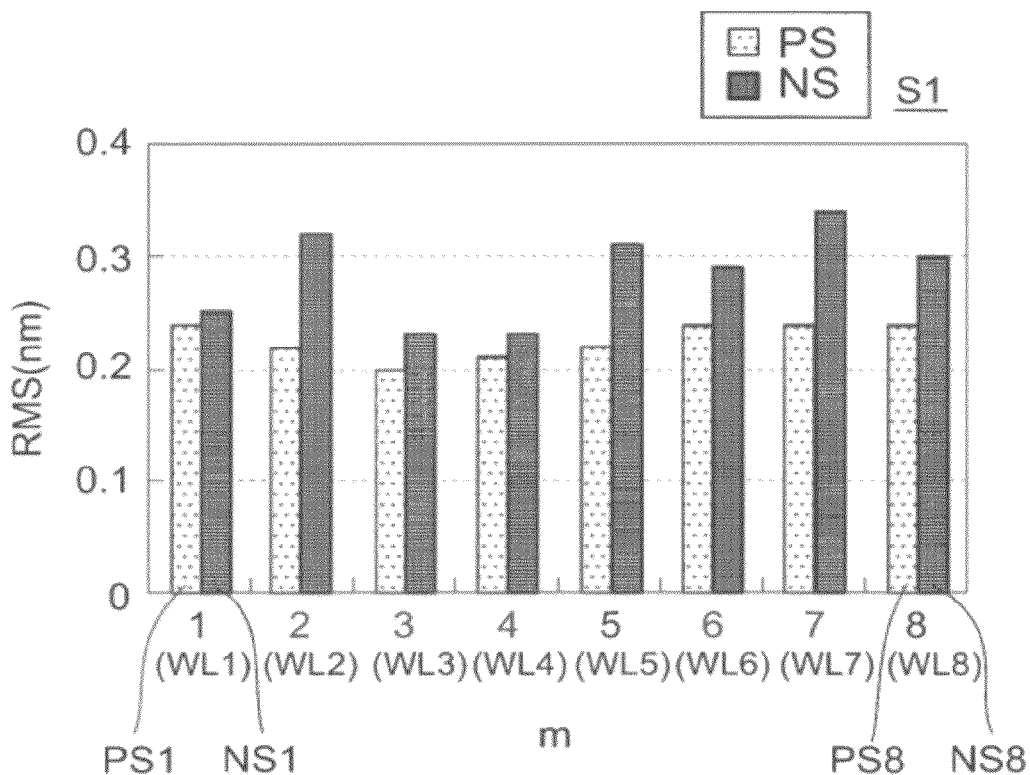

FIG. 7 is graph illustrating the characteristics of semiconductor light emitting devices.

The drawing shows the characteristics of the sample S1. The horizontal axis is the number "m" of the order of the well layers WL counted from the semiconductor layer 20. The vertical axis indicates the RMS of the p-side interface part PS and the RMS of the n-side interface part NS of each of the well layers WL.

For the sample S1 (i.e., the semiconductor light emitting device 110 according to the embodiment), as shown in FIG. 7, the RMS (variation in the concentration of In in a surface perpendicular to the +Z direction) of the p-side interface part PS (first p-side interface part PS1) does not exceed the RMS (variation in the concentration of In in a surface perpendicular to the +Z direction) of the n-side interface part NS (first n-side interface part NS1) in the well layer WL (first well layer WL) nearest to the second semiconductor layer 20 among the well layers WL. Specifically, as already described, the RMS of the first p-side interface part PS1 is 0.24 nm, and the RMS of the first n-side interface part NS1 is 0.25 nm.

Furthermore, for the sample S1 (semiconductor light emitting device 110), the RMS of the p-side interface part PS does not exceed the RMS of the n-side interface part NS in all the well layers WL of the first well layer WL1 to the eighth well layer WL8.

In other words, the RMS of the p-side interface part PS (variation in the concentration of In in a surface perpendicular to the +Z direction) does not exceed the RMS of the n-side interface part NS (variation in the concentration of In in a surface perpendicular to the +Z direction) in each of the well layers WL. In other words, the RMS of the i-th p-side interface part PSi does not exceed the RMS of the i-th n-side interface part NSi. In the specific example, the RMS of the i-th p-side interface part PSi is smaller than the RMS of the i-th n-side interface part NSi.

Furthermore, the RMS of the first p-side interface part PS1 is 0.25 nm.

It is thus desired that the RMS (variation in the concentration of In in a surface perpendicular to the +Z direction) of the p-side interface part PS (first p-side interface part PS1) does not exceed 0.25 nm in the well layer WL nearest to the second semiconductor layer 20 (first well layer WL), among the well layers WL.

Additionally, in each of the well layers WL, the RMS of the p-side interface part PS does not exceed 0.25 nm. It is thus further desirable that the RMS of the p-side interface part PS (variation in the concentration of In in a surface perpendicular to the +Z direction) does not exceed 0.25 nm in each of the well layers WL.

Consequently, the quantum efficiency in the light emitting layer 30 can be further enhanced. The wall plug efficiency can be enhanced thereby. The operating voltage Vf can be further reduced.

Although a smaller RMS of the n-side interface part NS is more desirable, it is tolerated to be larger than the RMS of the p-side interface part PS.

Figure 8:
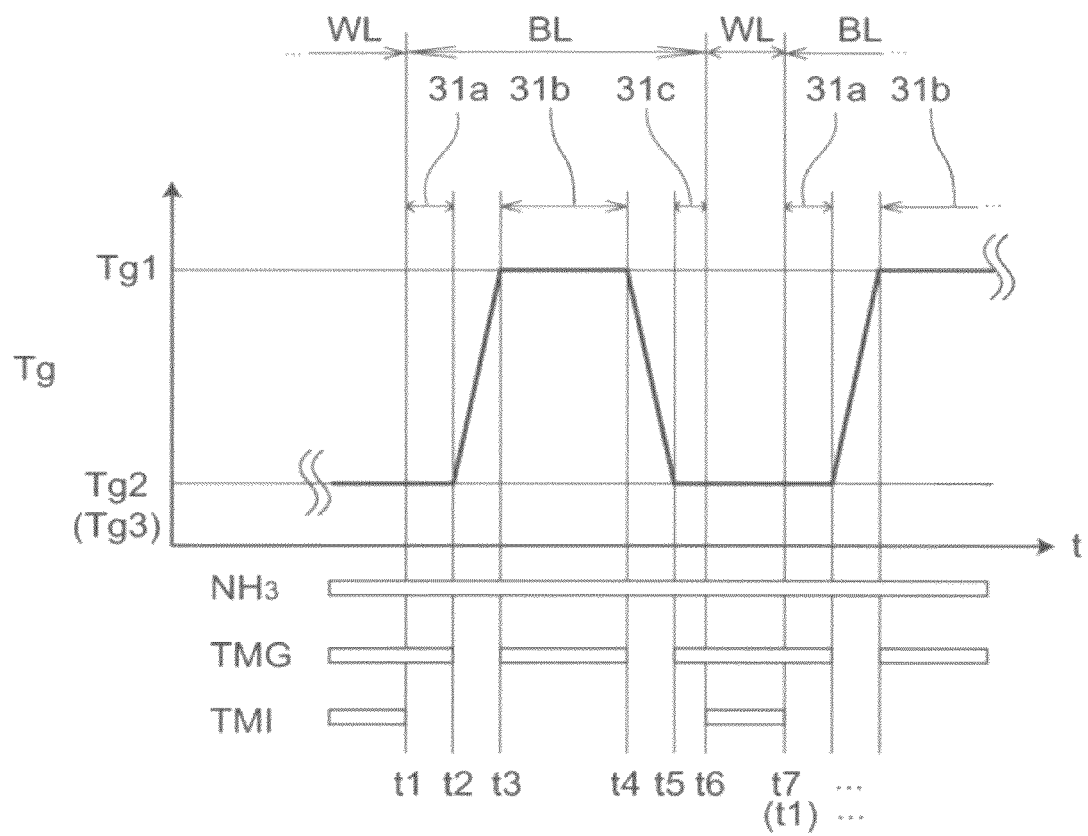
FIG. 8 is a schematic view showing a method for manufacturing the semiconductor light emitting device according to the embodiment.

FIG. 8 is a schematic view illustrating a method for manufacturing the semiconductor light emitting device according to the embodiment.

In other words, FIG. 8 illustrates the temperature profile when the light emitting layer 30 is formed by MOCVD, and the introduction timing of reaction gas. In the diagram, the horizontal axis represents the time t. The vertical axis represents the temperature Tg. In addition, the state of introduction of each reaction gas is shown along the horizontal axis. In the example, $NH_3$, TMG (Trimethylgallium), and TMI (Trimethylindium) are used as the reaction gas.

In the example, as shown in FIG. 8, the first barrier layer BL has a high temperature formation layer 31b formed at a temperature Tg1, and a low temperature formation layer (at least either an n-side low temperature formation 31a or a p-side low temperature formation 31c) formed at a second temperature Tg2 which is lower than the first temperature Tg1. The low temperature formation layer is provided between the high temperature formation layer 31b and the well layer WL.

The well layer WL is formed at a third temperature Tg3 which is lower than the first temperature Tg1. The third temperature Tg3 may be equal to the second temperature Tg2. In the following, description will be provided for an example in which third temperature Tg3 is equal to the second temperature Tg2.

The temperature Tg is set to the second temperature Tg2 (equal to the third temperature Tg3 in the example), and $NH_3$, TMG, and TMI are then introduced into the reactor. Thus, the well layer WL is formed. After having formed the well layer WL with a predetermined thickness, introduction of TMI is terminated at a timing t1.

$NH_3$ and TMG are introduced into the reactor with the temperature Tg being held at the second temperature Tg2 during a period from the timing t1 to a timing t2. Accordingly, the n-side low temperature formation layer 31a to be a part of the barrier layer BL is formed on the well layer WL. The thickness of the n-side low temperature formation layer 31a is 1 nm or more and 2 nm or less, for example. Introduction of TMG is terminated and formation of the n-side low temperature formation layer 31a is completed.

The temperature Tg is raised from the second temperature Tg2 to the first temperature Tg1 during a period from the timing t2 to a timing t3. Dissipation of In from the well layer WL during the process of raising the temperature is suppressed by the n-side low temperature formation layer 31a, for example.

Introduction of TMG is resumed at the timing t3 when the temperature Tg reached the first temperature Tg1. $NH_3$ and TMG are introduced into the reactor at the first temperature Tg1 during a period from the timing t3 to a timing t4. Thus, the high temperature formation layer 31b to be another part of the barrier layer BL is formed. After having formed the high temperature formation layer 31b with a predetermined thickness, introduction of TMG is terminated at the timing t4. The temperature Tg is dropped from the first temperature Tg1 to the second temperature Tg2 during a period from the timing t4 to a timing t5.

Introduction of TMG is resumed at the timing t5 when the temperature Tg dropped to the second temperature Tg2. Thus, the p-side low temperature formation layer 31c which is the second low temperature formation layer is formed.

Subsequently, introduction of TMI is resumed at a timing t6 when the p-side low temperature formation layer 31c reaches a predetermined thickness. $NH_3$, TMG, and TMI are introduced into the reactor at the second temperature Tg2 during a period from the timing t6 to a timing t7. Accordingly, the well layer WL is formed.

After the timing t7, the processes at and after the timing t1 are repeated.

For example, the p-side low temperature formation layer 31c may be omitted depending on the case.

The well layers WL and the barrier layers BL are alternately stacked on each other by repeating the above processes.

Here, it is preferred that the second temperature Tg2 is 830° C. or more. In addition, the difference between the first temperature Tg1 and the second temperature Tg2 is preferred to be 40° C. or more and 100° C. or less, more preferably, 40° C. or more and 60° C. or less. Thus, the intra-surface variation in the concentration of In in the p-side interface part PS and the n-side interface part NS, i.e., the RMS of the In iso-concentration surface on the p-side interface part PS and the n-side interface part NS can be easily reduced.

Variation in the concentration of In in the surface on the p-side interface part PS can be kept from exceeding the variation in the concentration of In in the surface on the n-side interface part NS by an appropriate formation condition of the semiconductor layer, such as the first temperature Tg1, the second temperature Tg2, and the second temperature Tg3, as well as the introduction timing of reaction gas.

When forming the light emitting layer 30 of a MQW structure on the stacked body 40 having a superlattice structure in the embodiment, the film formation condition of the stacked body 40 is made appropriate. Thus, intra-surface variation in the concentration of In of the n-side interface part NS in the well layer WL nearest to the first semiconductor layer 10 among the well layers WL is suppressed.

For example, it is desirable to keep the RMS of the eighth n-side interface part NS8 from exceeding 0.4 nm. In addition, it is desirable to keep the variation in the concentration of In in the surface on the first n-side interface part NS1 lower than the variation in the In in the surface on the eighth n-side interface part NS8.

Thus, the variation in the concentration of In in the surface on the first p-side interface part PS1 can be kept from exceeding the variation in the concentration of In in the surface on the first n-side interface part NS1, while suppressing the variation in the intra-surface concentration of In in the first p-side interface part PS1 and the first n-side interface part NS1.

In the embodiment, Metal Organic Chemical Vapor Deposition (MOCVD), Molecular Beam Epitaxy (MBE), Hydride vapor phase epitaxy (HVPE) or the like, for example, may be used for formation of the semiconductor layer.

As discussed above, a semiconductor light emitting device can be provided with a reduced operating voltage, according to the semiconductor light emitting device according to the embodiments.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

Hereinabove, exemplary embodiments of the invention are described with reference to the specific examples. However, the invention is not limited to the specific examples. For example, one skilled in the art may similarly practice the invention by appropriately selecting specific configurations of components included in semiconductor light emitting devices such as the first semiconductor layer, the second semiconductor layer, light emitting layers, well layers, barrier layers, high temperature formation layers, low temperature formation layers, stacked bodies, and electrodes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor light emitting devices practicable by an appropriate design modification by one skilled in the art based on the semiconductor light emitting devices described above as embodiments of the invention also are within the scope of the invention to the extent that the purport of the embodiments of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a first semiconductor layer of an n-type;
   a second semiconductor layer of a p-type; and
   a light emitting layer provided between the first semiconductor layer and the second semiconductor layer, and including at least two barrier layers separated by a well layer, the barrier layers including a nitride semiconductor, the well layer being provided between the barrier layers and including a nitride semiconductor containing In, the barrier layers and the well layer stacked in a first direction from the second semiconductor layer toward the first semiconductor layer,
   the well layer including a p-side interface part and an n-side interface part, the n-side interface part being provided between the p-side interface part and the first semiconductor layer,
   the p-side interface part being provided adjacent to one of the barrier layers, the one of the barrier layers being disposed between the well layer and the second semiconductor layer, the one of the barrier layers physically contacting the well layer, the p-side interface part having a first concentration of In, and
   the n-side interface part being provided adjacent to the other one of the barrier layers, the other one of the barrier layers being disposed between the well layer and the first semiconductor layer, the other one of the barrier layers physically contacting the well layer, the n-side interface part having a second concentration of In,
   a first variation of the first concentration in a first plane perpendicular to the first direction being not more than a second variation of the second concentration in a second plane perpendicular to the first direction.

2. The device according to claim 1, wherein
a root mean square of a 3-dimensional irregularity of the In iso-concentration surface in a surface perpendicular to the first direction in the p-side interface part is 0.25 nanometers or less.

3. The device according to claim 1, wherein
each of the barrier layers includes:
a high temperature formation layer formed at a first temperature; and
a low temperature formation layer provided between the high temperature formation layer and the well layer, and formed at a second temperature lower than the first temperature.

4. The device according to claim 1, wherein
a concentration of In in the barrier layers is lower than a concentration of In in the well layer.

5. The device according to claim 1, wherein
the barrier layers include $In_bGa_{1-b}N$ ($0 \leq b < 1$), and
the well layer includes $In_wGa_{1-w}N$ ($0 < w < 1$, $b < w$).

6. The device according to claim 1, wherein
a stacked body is provided between the first semiconductor layer and the light emitting layer.

7. The device according to claim 6, wherein
in the stacked body, a plurality of first layers and a plurality of second layers are alternately stacked.

8. The device according to claim 7, wherein
the first layers include $In_xGa_{1-x}N$ ($0 \leq x < 1$), and
the second layers include $In_yGa_{1-y}N$ ($0 < y \leq 1$, $x < y$).

9. The device according to claim 1, further comprising a sapphire substrate provided on the first semiconductor layer on an opposite side to the light emitting layer.

10. The device according to claim 1, wherein
the first semiconductor layer includes an n-type contact layer.

11. The device according to claim 10, wherein
the n-type contact layer includes GaN.

12. The device according to claim 10, further comprising a first contact electrode provided in the n-type contact layer.

13. The device according to claim 1, further comprising a second contact electrode part provided on the second semiconductor layer on an opposite side to the light emitting layer.

14. The device according to claim 3, wherein
the low temperature formation layer is provided between the high temperature formation layer and the well layer.

15. The device according to claim 3, wherein
each of the barrier layers includes a plurality of the low temperature formation layer, and
the high temperature formation layer is provided between the plurality of low temperature formation layers.

16. The device according to claim 3, wherein
the well layer is formed at a third temperature lower than the first temperature.

17. The device according to claim 16, wherein
the third temperature is equal to the second temperature.

18. The device according to claim 1, comprising:
plural well layers each separating a pair of opposed barrier layers,
each of the well layers having the p-side interface part and the n-side interface part, and
in each of well layers, the first variation of the first concentration in the first plane is not more than the second variation of the second concentration in the second plane.

19. The device according to claim 1, wherein
a root mean square of a 3-dimensional irregularity of an In iso-concentration surface in the first plane of the p-side interface part is not more than a square root of a 3-dimensional irregularity of an In iso-concentration surface in the second plane of the n-side interface part.

20. A semiconductor light emitting device comprising:
a first semiconductor layer of an n-type;
a second semiconductor layer of a p-type; and
a light emitting layer provided between the first semiconductor layer and the second semiconductor layer, and including
a plurality of barrier layers and well layers alternately stacked in a first direction from the second semiconductor layer toward the first semiconductor layer with well layers disposed between opposed barrier layers, each of the barrier layers including a nitride semiconductor, and each of the well layers including a nitride semiconductor containing In,
wherein one of the well layers is a p-side well layer located nearest to the second semiconductor layer among the well layers,
the p-side well layer including a p-side interface part and an n-side interface part, the n-side interface part being provided between the p-side interface part and the first semiconductor layer,
the p-side interface part being provided adjacent to one of the barrier layers, the one of the barrier layers being disposed between the p-side well layer and the second semiconductor layer, the one of the barrier layers physically contacting the p-side well layer, the p-side interface part having a first concentration of In, and
the n-side interface part being provided adjacent to an other one of the barrier layers, the other one of the barrier layers being disposed between the p-side well layer and the first semiconductor layer, and the other one of the barrier layers physically contacting the p-side well layer, the n-side interface part having a second concentration of In,
a first variation of the first concentration in a first plane perpendicular to the first direction being not more than a second variation of the second concentration in a second plane perpendicular to the first direction.

* * * * *